Sept. 19, 1950 A. H. TURNER 2,522,973

PUSH-BUTTON ULTRA HIGH FREQUENCY TUNER

Filed Jan. 30, 1945 4 Sheets-Sheet 1

INVENTOR.
ALFRED H. TURNER
BY C. D. Tuska
ATTORNEY

Sept. 19, 1950 A. H. TURNER 2,522,973

PUSH-BUTTON ULTRA HIGH FREQUENCY TUNER

Filed Jan. 30, 1945 4 Sheets-Sheet 2

INVENTOR.
ALFRED H. TURNER

BY

ATTORNEY

Sept. 19, 1950 A. H. TURNER 2,522,973

PUSH-BUTTON ULTRA HIGH FREQUENCY TUNER

Filed Jan. 30, 1945 4 Sheets-Sheet 3

INVENTOR.
ALFRED H. TURNER
BY C. D. Tuska
ATTORNEY

Sept. 19, 1950 A. H. TURNER 2,522,973

PUSH-BUTTON ULTRA HIGH FREQUENCY TUNER

Filed Jan. 30, 1945 4 Sheets-Sheet 4

INVENTOR.
ALFRED H. TURNER
BY
C D Tuska
ATTORNEY

Patented Sept. 19, 1950 2,522,973

UNITED STATES PATENT OFFICE 2,522,973

PUSH-BUTTON ULTRA HIGH FREQUENCY TUNER

Alfred H. Turner, Collingswood, N. J., assignor to Radio Corporation of America, a corporation of Delaware Application January 30, 1945, Serial No. 575,303

16 Claims. (Cl. 250—40)

Figures 1, 2, 3, 4, 5:
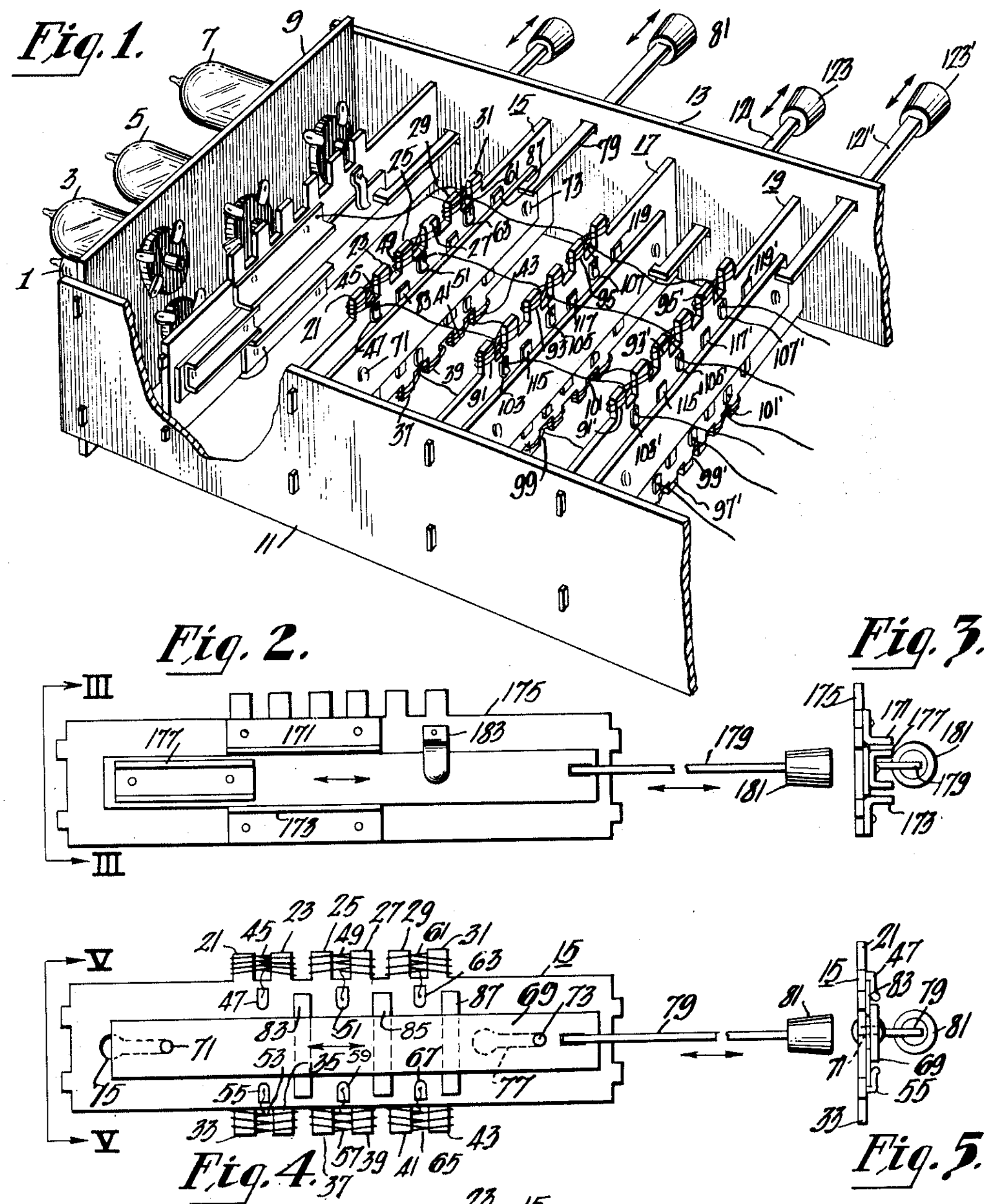

This invention relates generally to ultra-high frequency apparatus and more particularly to improved methods of and means for tuning such apparatus.

Conventional push-button switching mechanisms used in broadcast receivers frequently involve the use of many serially-connected contacts for switching a plurality of tuning elements. Such devices introduce objectionable losses at ultra-high frequencies. Furthermore, such switching mechanisms are not suitable for balanced circuit operation which is preferable at such frequencies. For this purpose, a balanced shorting switch mechanism of the progressive type appears to be most desirable.

At ultra-high frequencies, the use of balanced tuned circuits necessarily requires the use of twice as many tube elements as are required for unbalanced operation. However, this disadvantage is overcome by the fact that the tuning element (for example, a capacitor rotor or a shorting switch contact) may be "floated" in the tuned circuit, thus eliminating objectionable effects due to imperfect sliding contacts and relatively long chassis circuit paths. Balanced tuned circuits also appreciably reduce circuit radiation and hence the need for ultra-high frequency shielding between tuned circuits. Furthermore, balanced circuits decrease the tube and socket capacitances by a factor of 2, thereby increasing the effective product of gain times band width.

The instant invention contemplates the use of a plurality of pairs of relatively small inductors, the coils of successive pairs being serially-connected to provide a tunable line wherein relatively low mutual inductance is provided between adjacent coils of the same and different pairs of coils. This mutual inductance factor is maintained at a low value by spacing the coils of each pair and adjacent pairs at distances which are relatively large with respect to the physical dimensions of each of the coils. Tuning is accomplished by means of a switching mechanism providing progressive short-circuiting of the junctions between corresponding pairs of coils. Thus, the shorting contacts are effectively "floated" across the tunable line at different points thereon, depending upon the adjustment of the switching mechanism.

The invention is not limited to the use of coiled inductive elements, since for the higher frequencies these inductances may become essentially straight bars.

Typical ultra-high frequency tuners of the superheterodyne type will be described in greater detail hereinafter to illustrate the various embodiments of the invention. Basically, the complete tuner may comprise three tunable lines, each being of the type described heretofore, wherein substantial mutual coupling is provided between all three of the lines to provide the desired coupling between input, first detector, and oscillator circuits for superheterodyne operation. The shorting switch contact mechanisms for each of the tunable lines may be ganged together and may be operated by rotary and/or push-button actuating mechanisms in any of the manners described in detail hereinafter.

A first embodiment of the invention to be described hereinafter employs a plurality of push-buttons, the actuation of any one of which provides tuning to a desired signal frequency. A second embodiment of the invention, which requires a simpler switching mechanism, employs a plurality of push-buttons coupled to the switching mechanism through a lever element. A modification of the invention employs a plurality of push-buttons which are coupled in an interlocking manner to provide successively multiple actuation of a plurality of push-buttons of the type to be described in the first embodiment of the invention, whereby successively different numbers of shorting switch mechanisms are actuated upon operation of different ones of the push-buttons. A third embodiment of the invention employs a plurality of double-throw switching mechanisms which are actuated by double-throw push-button devices whereby each of the push-buttons may be actuated to either of two operable positions. This arrangement provides tuning of the tunable lines with half the number of push-buttons required in the other embodiments of the invention.

Among the objects of the invention are to provide an improved method of and means for tuning ultra-high frequency apparatus. Another object of the invention is to provide an improved ultra-high frequency tuner having adjustable tuning elements which are "floated" in the tunable circuits. A further object of the invention is to provide an ultra-high frequency tuner employing a plurality of pairs of serially-connected reactive elements, wherein tuning is accomplished by progressively short-circuiting predetermined sections of each of said elements to provide separate tuning of said elements.

Another object of the invention is to provide an ultra-high frequency tuner employing a plurality of tunable lines each having means for short-circuiting predetermined sections of said line, and means for simultaneously actuating all of said short-circuiting means. A further object of the invention is to provide an improved ultra-high frequency tuner employing push-button tuning. Another object of the invention is to provide an ultra-high frequency tuner adapted to push-button operation for successively short-circuiting predetermined sections of a plurality of mutually coupled tuned lines.

Additional objects of the invention include an improved ultra-high frequency tuner employing a plurality of two-position switching mechanisms which are actuated by push-button elements. Still another object of the invention is to provide an improved ultra-high frequency tuner employing a plurality of push-buttons which are coupled through a lever mechanism to actuate a plurality of progressively short-circuiting switch mechanisms which are coupled to a plurality of tuned circuits. Another object is to provide an improved tuning mechanism including a plurality of interlocked push-button switching devices. A further object is to provide a tuning mechanism employing a plurality of push-button devices each having two operative positions and an inoperative position.

Figure 6:
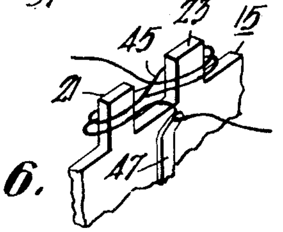
Figure 7:
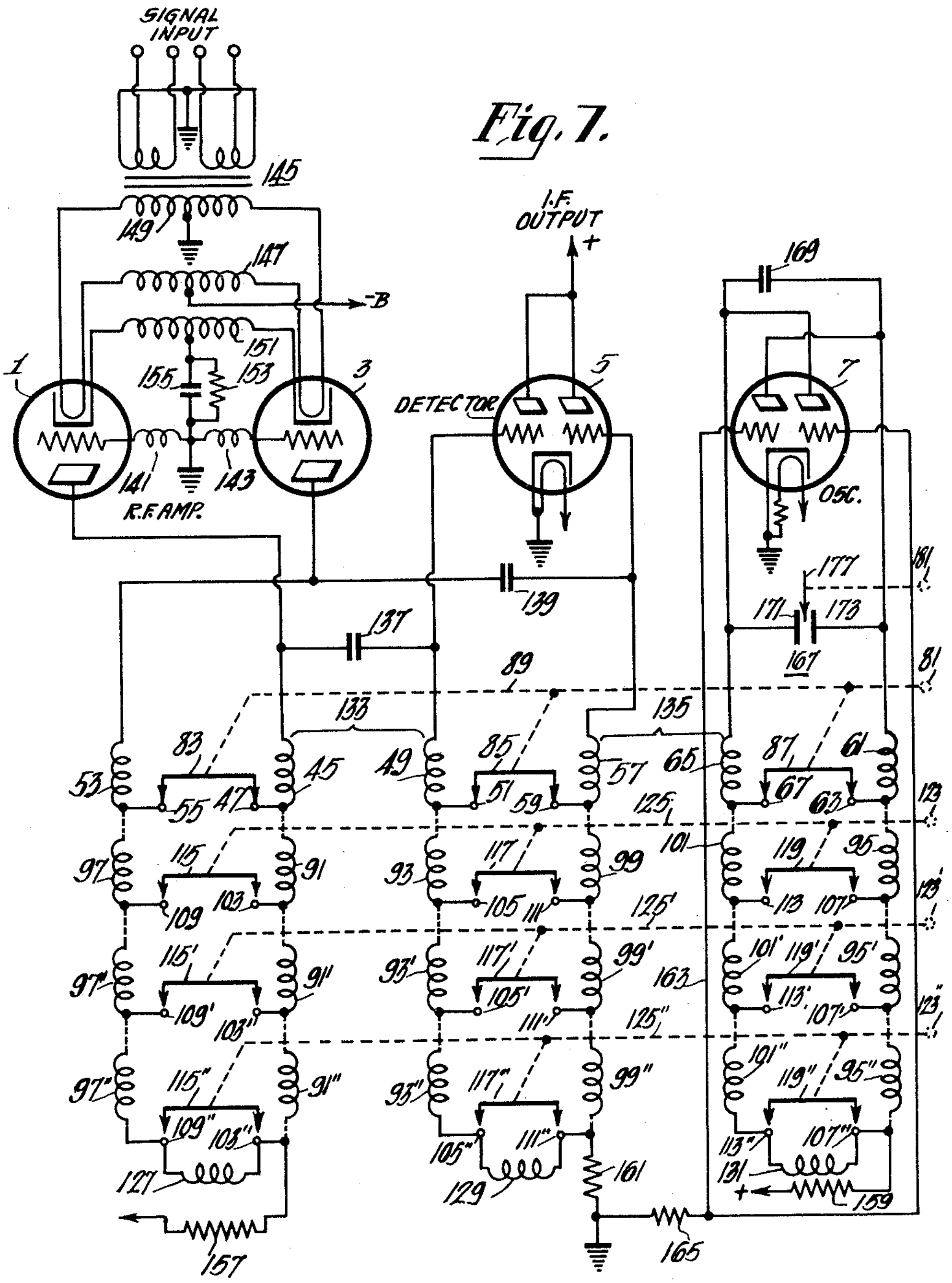
Figure 8:
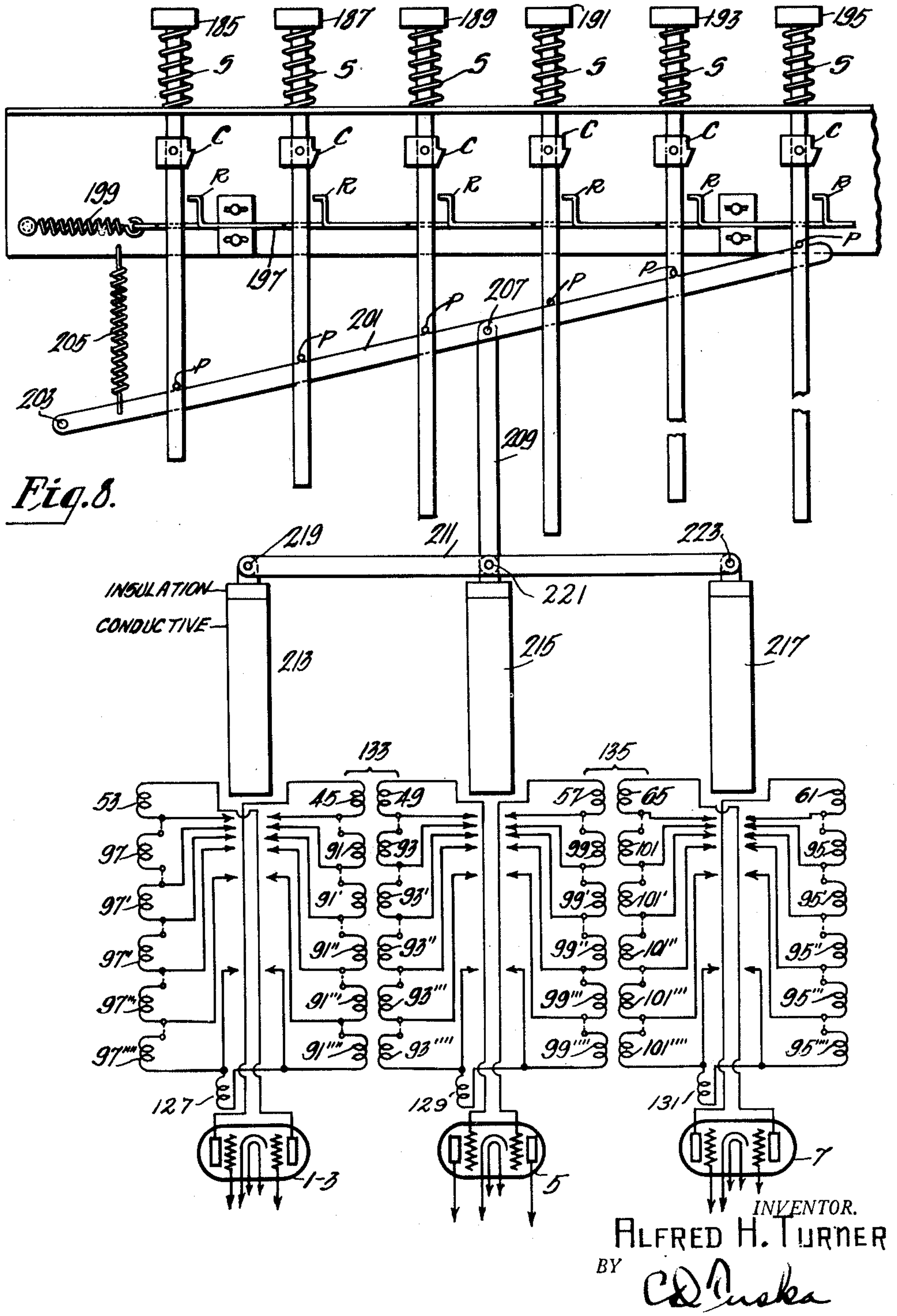
Figure 9:
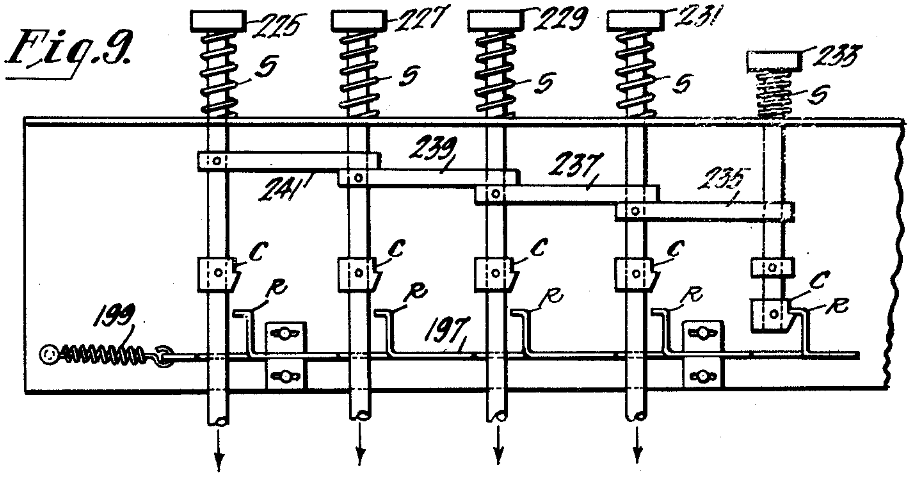
Figure 10:
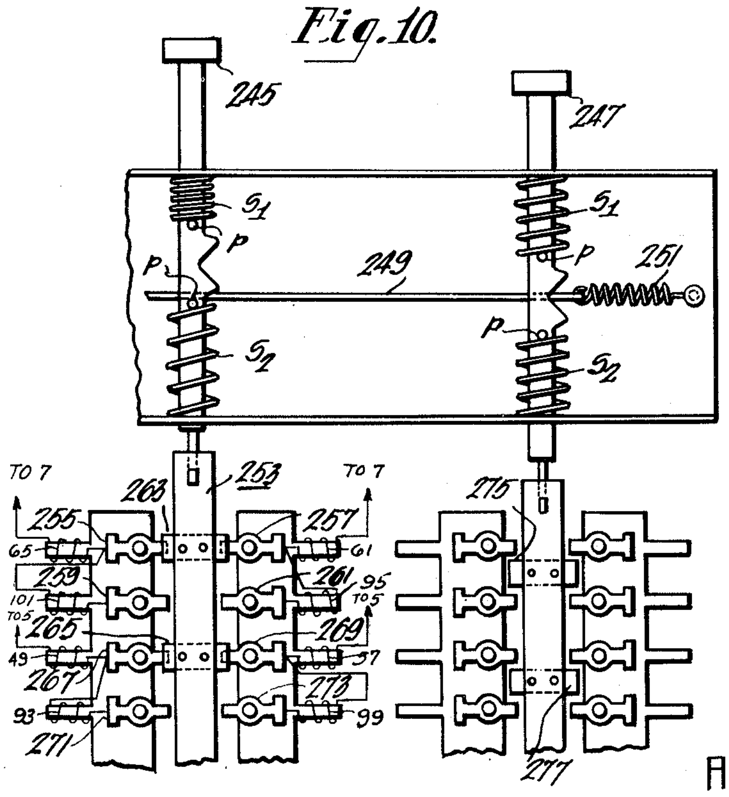
Figure 11:
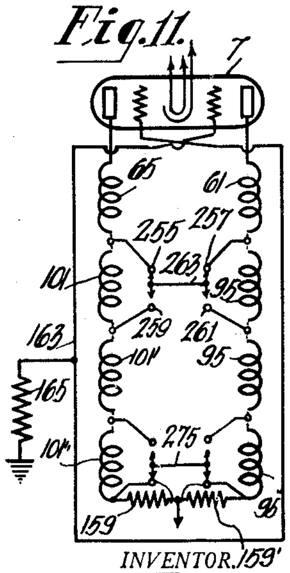

The invention will be described in greater detail by reference to the accompanying drawings of which Figure 1 is a perspective view of one embodiment of the invention; Figure 2 is a side elevational view of the trimmer capacity element of Figure 1; Figure 3 is an end elevational view of Figure 2 taken along the line III—III; Figure 4 is a side elevational view of one of the push-button switching mechanisms of the device of Figure 1; Figure 5 is an end elevational view of Figure 4 taken along the line V—V; Figure 6 is an enlarged fragmentary view of the coil structure and supports shown in Figure 4; Figure 7 is a schematic circuit diagram of a typical superheterodyne tuner employing the switching mechanism shown in Figure 1; Figure 8 is a partially schematic illustration of a second embodiment of the invention employing a lever mechanism; Figure 9 is a fragmentary plan view of an interlocking modification of the first embodiment of the invention shown in Figure 1; Figure 10 is a fragmentary plan view of a third embodiment of the invention employing a plurality of push-buttons each having two active and one inactive operating position, and Figure 11 is a schematic circuit diagram showing typical connections of a device of the type shown in Figure 10 employed in a tuned line of the general type shown in greater detail in Figure 1. Similar reference characters are applied to similar elements throughout the drawings.

Referring to Figures 1 to 7, inclusive, a typical ultra-high frequency superheterodyne tuner is employed to illustrate the novel features of the invention. A pair of triodes, 1, 3, connected as radio frequency amplifiers; a double triode first detector 5 and a double triode beat-frequency oscillator 7, all having conventional tube sockets, are mounted upon one end 9 of a metallic chassis having parallel-disposed opposite sides 11, 13. The details of the tube connections will be described by specific reference to Figure 7.

The tuned circuits connected to each of the tubes comprise a plurality of serially-connected inductive elements which are mounted upon parallel-disposed insulating supports 15, 17, 19, which extend normal to and between the parallel-disposed chassis sides 11, 13. Each of the coil supports comprise a flat insulating strip having a plurality of projections on opposite edges thereof for supporting the coil windings. Adjacent each pair of projecting elements is a fixed contact element which engages a corresponding movable contact element supported by a slidable insulating member which is arranged to be moved parallel with the fixed insulating coil supporting strip. Longitudinal adjustment of the movable contact structure is accomplished by means of any conventional or special push-button mechanism.

Referring to Figures 4, 5 and 6, a typical one of the coil supporting strips 15 includes coil supporting projections 21, 23, 25, 27, 29, 31, extending from the upper edge thereof. Also, it includes additional coil supporting projections 33, 35, 37, 39, 41, 43 extending from the lower edge thereof directly opposite to the upper coil supporting projections. The upper projections 21, 23 support a figure-of-eight or binocular type winding 45 as shown in Fig. 6, one end of which is terminated in a first fixed contact 47, and the remaining end of which is connected to the anode of the first radio frequency amplifier triode 1.

Similarly, the upper projecting elements 25, 27 support a second binocular winding 49, one end of which is terminated in a second fixed contact 51 and the remaining terminal of which is connected to the grid of one of the triodes of the double triode first detector 5. The lower projecting elements 33, 35 support a third binocular winding 53, one end of which is terminated in a third fixed contact 55 which is disposed directly opposite to the first fixed contact 47. The remaining terminal of the third binocular winding 53 is connected to the anode of the second radio frequency amplifier triode 3. Similarly, the lower projecting elements 37, 39 support a fourth binocular winding 57, one end of which is terminated in a fourth fixed contact 59 which is disposed directly opposite to the second fixed contact 51. The remaining terminal of the fourth binocular winding 57 is connected to the grid of the second triode section of the double triode first detector 5.

The upper projecting elements 29, 31 support a fifth binocular winding 61, one end of which is terminated in a fifth fixed contact 63, and the remaining terminal of which is connected to the anode of the first section of the double triode oscillator 7. The lower projecting elements 41, 43 support a sixth binocular winding 65, one end of which is terminated in a sixth fixed contact 67, which is disposed directly opposite to the fifth fixed contact 63. The remaining end of the sixth binocular winding 65 is connected to the anode of the second section of the double triode oscillator 7. The longitudinally movable contact supporting strip 69 includes a pair of fixed pins 71, 73 which move within keyhole slots 75, 77 in the coil supporting strip 15. The position of the movable contact strip 69 may be adjusted by means of any conventional push-button mechanism including, for example, a shaft 79 and a knob 81, the shaft 79 extending through the chassis side 13. The movable contact strip 69 supports three short-circuiting contacts 83, 85 and 87. The first short-circuiting contact 83 is arranged to short-circuit the first and third fixed contacts 47, 55 when the push-button mechanism 79, 81 is depressed inwardly. Similarly, the second short-circuiting contact 85 is arranged to short-circuit the second and fourth fixed contacts 51, 59 when the push-button is depressed. In a like manner, the third short-circuiting contact 87 is arranged to short-circuit simultaneously the fifth and sixth fixed contacts 63, 67 when the push-button is depressed. The simultaneous actuation of the contact elements 83, 85, 87 is indicated in Figure 7 by means of the dash lines 89. It should be understood that the details of the push-button mechanism have been omitted to simplify the description and illustration of the invention, and that conventional or special detent, push-button restoring or interlocking devices may be incorporated therewith.

The second coil supporting strip 17 similarly supports additional binocular windings 91, 93, 95 and 97, 99, and 101 which are serially-connected with the binocular windings supported by the first coil supporting strip 15 as indicated in the circuit diagram of Figure 7.

One terminal of the seventh binocular winding 91 is connected to the first fixed contact 47 on the first coil support 15 and the remaining end of said winding is terminated in a corresponding fixed contact 103 on the second coil support 17. Likewise, one terminal of the eighth binocular winding 93 is connected to the second fixed contact 51 of the first coil support 15, and the remaining end thereof is terminated in a second fixed contact 105 on the second coil support 17. In a like manner, the ninth binocular winding 95 is terminated in the fifth fixed contact 63 of the first coil support 15, and the remaining end thereof is terminated in a third fixed contact 107 on the second coil support 17.

Similarly, the tenth winding 97 is connected to the third fixed contact 55 on the first coil support 15 and terminated in a fixed contact 109 on the second coil support 17; the winding 99 is connected to the fixed contact 59 on the first coil support 15 and the remaining end thereof is connected to a fixed contact 111 on the second coil support 17. Also, the winding 101 is connected to the fixed contact 67 on the first coil support 15 and to a corresponding fixed contact 113 on the second coil support 17. Movable contacts 115, 117 and 119 are arranged to short-circuit, respectively, the fixed contacts 103 and 109; 105 and 111; and 107 and 113, upon actuation of a second push-button mechanism including a shaft 121 and knob 123. The simultaneous actuation of the movable contacts 115, 117 and 119 is indicated by means of the second dash line 125 in Figure 7.

Thus, actuation of the first push-button knob 81 simultaneously actuates the movable contacts 83, 85 and 87, connecting together the ends of the windings 53, 45; 49, 57; and 61, 65 at the ends thereof which are remote from the coil connections to the corresponding tubes. However, alternate actuation of the second push-button knob 123 which actuates the movable contacts 115, 117 and 119, short-circuits the ends of the inductive circuit comprising two coils in each side of each of the tuned lines connected to the tubes, thereby lowering the resonant frequency of the tube circuits. Since additional detailed description of the tuned lines and the contact adjustment thereof by means of additional push-buttons, should not be necessary, it should suffice to state that as many additional line inductive sections may be added as may be required for the specific tuning conditions encountered, and that the line connected to the radio frequency amplifier tubes may be terminated by a first terminating reactor 127. Such additional push-button, inductive elements and switches are illustrated by elements having primed numbers corresponding to similar elements described heretofore. Similarly, the line connected to the first detector 5 may be terminated by a second terminating reactor 129, and the line connected to the oscillator 7 may be terminated by a third terminating reactor 131. It should be understood that due to the restricted magnetic fields of the various binocular windings, slight or negligible mutual inductive coupling will be provided between the serially-connected elements of each of the tuned lines and between the corresponding oppositely-disposed pairs thereof, while substantial mutual coupling will be provided between adjacent ones of the lines, as indicated by the brackets 133, 135, to provide desired reaction between the R. F. amplifier, first detector, and oscillator networks for superheterodyne operation. Each line (when considered as a whole, as a large single turn coil) is mutually coupled to another of the lines, whereas the individual binocular windings or coils of one line or of separate lines are negligibly coupled. Due to the relatively wide frequency band to be covered, reaction between the radio frequency amplifier and first detector circuits may be compounded by means of cross-coupling capacitors 137 and 139 as disclosed and claimed in applicant's United States Patent No. 2,408,896 granted October 8, 1946. By means of this cross-coupling arrangement, variations in reaction due to the standing wave characteristics of the line over an extended frequency band may be compensated by means of the inserted capacitive coupling.

The grid circuits of the radio frequency amplifiers include parallel-connected inductive segments 141 and 143, having a common ground connection. Input signals are applied from any conventional antenna system, not shown, to predetermined primary terminals of a powdered-iron core, low impedance input transformer 145 which is coupled in a balanced manner to the cathode circuits of the radio frequency amplifier tubes 1, 3 through the capacity between the heater and cathode elements of the tubes. The negative terminal of the anode voltage supply for the R. F. amplifier tubes 1, 3 is connected to the center tap of the secondary of a filament supply transformer winding 147, the output terminals of which are connected in series with the heater elements of the tubes 1 and 3 and the low impedance secondary winding 149 of the input transformer 145. The cathodes of the tubes 1 and 3 are connected together through a center tapped reactor 151, the center tap of which is grounded through a conventional bias resistor and capacitor 153, 155.

The common cathode and heater element of the first detector double triode 5 are grounded. The anodes of the balanced first detector 5 are connected together and connected to an output intermediate frequency amplifier circuit, not shown, which also provides a source of positive anode potential for the tube. The positive anode potential for the R. F. amplifier may be supplied through a first blocking resistor 157 to one of the terminals of the first terminating reactor 127. In a similar manner, anode potential for the oscillator tubes may be supplied through a second blocking resistor 159 to one terminal of the third terminating reactor 131. The second terminating reactor 129 of the first detector tuned line may be grounded through a third blocking resistor 161.

The grid circuit of the balanced oscillator tube 7 includes a continuous conductor 163 which is inductively coupled to the windings of the oscillator tuned line by being disposed adjacent thereto. The center point of the grid conductor 163 may be grounded through a fourth terminating resistor 165.

The resonant frequency range of the oscillator may be adjusted by means of a trimmer capacitor 167 which will be described in greater detail by reference to Figures 2 and 3. The trimmer capacitor is connected between the anodes of the balanced oscillator tubes to tune the resonant lines connected thereto. If desired, the trimmer capacitor 167 may be shunted by a loading capacitor 169 having a negative temperature coefficient to minimize the frequency drift of the oscillator.

Referring to Figures 1, 2 and 3, the trimmer capacitor may comprise a pair of fixed capacitor plates 171, 173 supported by an insulating strip 175 extending between the opposite sides 11, 13 of the chassis. The two fixed plates are connected to the capacitor terminals. The capacity of the unit may be adjusted by means of a movable U-shaped conductive element 177, which may be moved longitudinally with respect to the fixed plates 171, 173 by means of a shaft 179 which extends through the chassis side 13 and is terminated in a push-button knob 181. A guide 183, supported by the fixed insulating strip 175, prevents lateral motion of the capacitor adjustable element 177 with respect to the fixed plates 171, 173. The capacitor is adjusted to provide maximum capacitance when the knob 181 is pulled outwardly, and minimum capacitance when the knob 181 is depressed to its maximum inwardly position.

In Figure 8, a plurality of push-buttons 185, 187, 189, 191, 193 and 195, each including a restoring spring S and a notched collar C, coact with a detent bar 197 which is biased by a detent spring 199. Sear elements R, extending from the detent bar 197 adjacent each of the push-buttons, cooperate with the notched collars C to maintain in a depressed position each push-button after actuation thereof. For example, push-button 187 will remain in a depressed position until one of the other push-buttons is actuated, at which time the second push-button will remain depressed and the first push-button 187 will return to its normal position under control of its spring S. Each of the push-button rods includes a pin P which contacts the side of a lever element 201 which is pivoted at the point 203 and maintained in contact with the push-button pins P by means of a biasing spring 205. The ends of the push-button rods remote from the push-buttons are slotted or otherwise arranged to prevent their disengagement from the lever element 201 upon actuation of others of the push-buttons.

At a point 207 intermediate the ends of the lever element 201, a coupling element 209, having a cross piece 211, couples the lever element to three, relatively long, movable contact segments 213, 215, 217 which are hinged to the cross bar 211, at the points 219, 221, and 223, respectively. The vertically movable contact segments 213, 215, 217 are positioned to contact successively a plurality of fixed contact elements which are connected to the junctions of the successive inductive elements forming each of the tuned lines as described heretofore. The lines are connected to the tube electrodes as described with respect to the circuit of Figure 1. It should be understood that the fixed contacts should be spaced with respect to each other to provide successive short-circuiting of contact pairs of actuation of different ones of the push-buttons.

The contact segments 213, 215, 217 may be continuously conductive, in which instance predetermined ones of the fixed contacts will be short-circuited for actuation of different ones of the push-buttons. Alternatively, if the contact segments include only a relatively narrow conductive portion, only one pair of fixed contacts in each line will be short-circuited upon actuation of a predetermined one of the push-buttons. It should be understood that the relative spacing of the fixed contacts in the tuned lines, the leverages of the system and the spacings of the push-buttons, will determine the mechanical proportions of the system in a manner well known to those skilled in the art.

Figure 9 shows a typical push-button system including push-buttons 225, 227, 229, 231 and 233, having button-restoring springs S and notched collars C which operate in conjunction with a detent bar 197 and sears R in the same manner as described heretofore in the structure illustrated in Figure 8. However, an interlocking arrangement of push-buttons is provided by means of a succession of lateral bars 235, 237, 239 and 241 each of which is pinned securely to one of the push-button shafts and is "floated" upon the adjoining push-button shaft immediately above the point at which the next of said lateral arms is pinned to said adjoining shaft. Thus, depression of the second push-button 227, for example, would provide actuation of push-buttons 227, 229, 231 and 233. However, depression of the fourth push-button 231 would provide depression only of push-buttons 231, 233. In the arrangement illustrated, the fifth push-button 233 is employed only for releasing the detent mechanism to restore all of the other push-buttons to a neutral position. The structure illustrated in Figure 9 may be substituted, for example, for the conventional push-button mechanism generally illustrated and described with respect to Figures 1 to 7. This arrangement thus would provide simultaneous short-circuiting of a plurality of sections of each of the tuned lines to provide comparable operation to the device illustrated in Figure 8.

Figure 10 illustrates a push-button mechanism having two operative and one inoperative position for each push-button, whereby the number of push-buttons for tuning a receiver to a required number of stations would be reduced by a factor of 2. Two typical push-buttons 245 and 247 each include upper and lower restoring springs $S_1$ and $S_2$ which bias the push-buttons to a neutral position (as shown for push-button 247) by force applied to pins *p* extending through the push-button shaft adjacent each of the springs. An apertured detent bar 249, biased by a detent spring 251, maintains either of the push-buttons in either operative or neutral position. The operative positions of the push-buttons are determined by an M-shaped conformation on one side of each of the push-button shafts which engage with the apertured detent plate 249. In order that a push-button in one of the operative positions (such as push-button 245) may be actuated directly, the upper and lower portions of the projections are slightly sloped to permit operation of the push-button from one operative position through neutral to the other operative position. Actuation of any push-button thereby releases the detent which may be holding any other push-button in an operative position.

A portion of a typical triple-pole double-throw shorting switch is shown connected to each of the push-buttons. The first switch 253, actuated by the first push-button 245 is shown in one of its operative positions whereby the fixed contacts 255 and 257 are short-circuited, and also the contacts 259 and 261 are short-circuited by means of the movable contacts 263 and 265, respectively, which are actuated by the push-button shaft. Actuation of the push-button shaft in a downward direction for short-circuiting of the other contacts 267 to 269, and 271 to 273 would provide the other operative position.

The second push-button 247 is shown in the neutral position whereby the short-circuiting contacts 275 and 277 are not in engagement with any of the fixed contacts adjacent thereto. The equivalent circuit diagram of a typical resonant circuit such, for example, as the oscillator circuit of Figure 7, is illustrated in Figure 11 to indicate the manner in which a pair of triple-pole double-throw push-buttons may be employed in accordance with the invention.

Thus the invention described comprises several embodiments and modifications thereof of improved push-button ultra-high frequency tuners for circuits wherein switching of resonant elements of tuned circuits is required. The application of the various features of the invention to interlocking, single action, multiple action, and lever type push-button systems of the progressive type are illustrated and described in combination with ultra-high frequency superheterodyne tuned circuits and the like.

I claim as my invention:

1. An ultra-high frequency tuner including a plurality of parallel-disposed insulating supports each having a plurality of projections from the sides thereof, switch contacts mounted upon said supports adjacent said projections, a plurality of lines each comprising a plurality of windings supported by said projections and connected to said switch contacts, each of said lines having substantial mutual coupling with an adjacent line and coupling being minimized between individual windings on the same and the other supports, means serially connecting corresponding windings on each of said supports, and movable switch contact means on each of said supports operable with said fixed contacts for selectively connecting together windings on each of said supports.

2. An ultra-high frequency tuner including a plurality of parallel-disposed insulating supports each having a plurality of projections from the opposite sides thereof, switch contacts mounted upon said supports adjacent said projections, a plurality of lines each comprising a plurality of windings supported by said projections and connected to said switch contacts, each of said lines having substantial mutual coupling with an adjacent line and coupling being minimized between individual windings on the same and the other supports, means serially connecting corresponding windings on each of said supports, and movable switch contact means on each of said supports operable with said fixed contacts for selectively connecting together said oppositely-disposed windings on each of said supports.

3. An ultra-high frequency tuner including a plurality of parallel-disposed insulating supports each having a plurality of elements projecting from the opposite sides thereof, switch contacts mounted upon said supports adjacent said projecting elements, a plurality of lines each comprising a plurality of windings supported by said projecting elements and connected to said switch contacts, each of said lines having substantial mutual coupling with an adjacent line and coupling being minimized between individual windings on the same and the other supports, means serially connecting corresponding windings on each of said supports, and longitudinally movable switch contact means on each of said supports operable with said fixed contacts for selectively connecting together said oppositely-disposed windings on each of said supports.

4. An ultra-high frequency tuner including a plurality of parallel-disposed insulating supports each having a plurality of elements projecting from the opposite sides thereof, switch contacts mounted upon said supports adjacent said projecting elements, a plurality of lines each comprising a plurality of windings supported by said projecting elements and connected to said switch contacts, each of said lines having substantial mutual coupling with an adjacent line and coupling being minimized between individual windings on the same and the other supports, means serially connecting corresponding windings on each of said supports, and longitudinally movable switch contact means on each of said supports operable with said fixed contacts for sequentially connecting together said oppositely-disposed windings on predetermined ones of said supports.

5. Apparatus as described in claim 3 including an actuating mechanism for said movable switch contact means comprising a plurality of push-buttons, and means coupling said push-buttons to said movable contact means.

6. Apparatus as described in claim 3 including an actuating mechanism for said movable switch contact means comprising a lever element pivoted at a predetermined point, a plurality of push-buttons operable upon said lever element at relatively spaced points, and means coupled between said lever element and said movable contacts to move said movable contacts different amounts in response to actuation of different ones of said push-buttons.

7. Apparatus as described in claim 3 including an actuating mechanism for said movable switch contact means comprising a lever element pivoted at a predetermined point, a plurality of push-buttons operable upon said lever element at relatively equidistantly spaced points, and means coupled between said lever element and said movable contacts to move said movable contacts different amounts in response to actuation of different ones of said push-buttons.

8. Apparatus as described in claim 3 including an actuating mechanism for said movable switch contact means comprising a lever element pivoted at a predetermined point, a plurality of push-buttons operable upon said lever element at relatively equidistantly spaced points, means coupled between said lever element and said movable contacts to move said movable contacts different amounts in response to actuation of different ones of said push-buttons, and detent means for selectively locking predetermined ones of said push-buttons in operative position upon actuation thereof.

9. Apparatus as described in claim 3 including an actuating mechanism for said movable switch contact means comprising a plurality of push-buttons operable upon said movable switch contacts at relatively equidistantly spaced points, means coupled between said push-buttons and said movable contacts to move said movable contacts in response to actuation of different ones of said push buttons, and means providing simultaneous actuation of different predetermined ones of said push-buttons in response to actuation of each of said push-buttons.

10. Apparatus as described in claim 3 including an actuating mechanism for said movable switch contact means comprising a plurality of push-buttons operable upon said movable switch contacts, and means coupled between said push-buttons and said movable contacts to move selectively each of said movable contacts to three different positions in response to actuation of each of said different ones of said push-buttons.

11. Apparatus as described in claim 3 including an actuating mechanism for said movable switch contact means comprising a plurality of push-buttons operable upon said movable switch contacts, means coupled between said push-buttons and said movable contacts to move selectively each of said movable contacts to three different axial positions in response to actuation of each of said different ones of said push-buttons, and detent means responsive to actuation of any one of said push-buttons for actuating the remainder of said push-buttons in a predetermined manner.

12. A high frequency tuner comprising a shelf member, a pair of frame members, each having an end secured to said shelf member, a plurality of tunable transmission lines, supports for said transmission lines comprising insulating members extending between said frame members and secured at their ends to said frame members, and movable tuning means extending through a frame member and being accessible exteriorly of the tuner.

13. A high frequency tuner comprising a shelf member, a pair of frame members, each having an end secured to said shelf member, a plurality of tunable transmission lines, insulating members supported from said frame members for carrying the tunable transmission lines, vacuum tube socket devices secured on said shelf member and connections from said vacuum tube socket devices directly to said transmission lines.

14. A high frequency tuner comprising a plurality of balanced tunable transmission lines, each line comprising a plurality of lumped impedance means, adjacent ones of said lines having substantial mutual coupling, a plurality of insulating supporting means disposed to support the impedance elements of the transmission lines, a plurality of switching contacts mounted upon said supporting means, one contact being connected to one end of each lumped impedance element, means for connecting corresponding lumped impedance elements in series thereby providing transmission lines each having two branches, each line being tunable by interconnecting a contact associated with an impedance element of one branch with the corresponding impedance element of the other branch, and movable switching means for cooperating with said fixed contacts for selectively connecting together lumped impedance elements to provide simultaneous tuning of all of said lines.

15. A high frequency tuner including a balanced line at least a portion of which comprises a plurality of pairs of serially-connected figure-of-eight windings located at spaced points to minimize mutual coupling between said serially-connected windings and between different ones of said pairs of windings, and switching means for selectively connecting together corresponding terminals of said pairs of windings to adjust the resonant characteristics of said line.

16. A high frequency tuner including a plurality of insulating supporting means disposed to support the impedance elements of a plurality of balanced tunable transmission lines, switch contacts mounted upon said supporting means, each of said lines comprising a plurality of lumped impedance means supported by said insulating supporting means and connected to said switch contacts, adjacent ones of said lines having substantial mutual coupling, and coupling being minimized between others of said windings on the same and the remaining of said supports, means serially connecting corresponding windings on each of said supports, and movable switch contact means on each of said supports operable with said fixed contacts for selectively connecting together windings on each of said supports.

ALFRED H. TURNER.

REFERENCES CITED

The following references are of record in the file of this patent:

UNITED STATES PATENTS

| Number | Name | Date |
|---|---|---|
| 1,835,036 | Gehm | Dec. 8, 1931 |
| 1,938,073 | Kramar | Dec. 5, 1933 |
| 1,947,003 | Finch | Feb. 13, 1934 |
| 2,115,619 | Carpenter | Apr. 26, 1938 |
| 2,125,900 | Evans | Aug. 9, 1938 |
| 2,150,562 | Reid | Mar. 14, 1939 |
| 2,154,778 | Schnell | Apr. 18, 1939 |
| 2,194,543 | Curtis | Mar. 26, 1940 |
| 2,210,379 | Pasma | Aug. 6, 1940 |
| 2,214,506 | Manning et al. | Sept. 10, 1940 |
| 2,219,687 | Kenney | Oct. 29, 1940 |
| 2,245,388 | Conron et al. | June 10, 1941 |
| 2,260,088 | Polydoroff | Oct. 21, 1941 |
| 2,289,147 | Shea | July 7, 1942 |
| 2,292,254 | Van Buren | Aug. 4, 1942 |
| 2,295,173 | Hoffmann et al. | Sept. 8, 1942 |
| 2,297,819 | Wagenknecht | Oct. 6, 1942 |
| 2,297,889 | Hoffmann et al. | Oct. 6, 1942 |
| 2,299,082 | Elliott | Oct. 20, 1942 |
| 2,347,315 | Fill | Apr. 25, 1944 |